United States Patent
Andberg

[11] Patent Number: 6,140,616
[45] Date of Patent: Oct. 31, 2000

[54] WAFER LEVEL BURN-IN AND TEST THERMAL CHUCK AND METHOD

[75] Inventor: John W. Andberg, Santa Cruz, Calif.

[73] Assignee: AEHR Test Systems, Fremont, Calif.

[21] Appl. No.: 09/161,323

[22] Filed: Sep. 25, 1998

[51] Int. Cl.$^7$ .............................. H05B 3/68; C23C 16/00
[52] U.S. Cl. ........................ 219/444.1; 118/724
[58] Field of Search .............................. 219/444.1, 445.1, 219/446.1, 448.11, 544; 361/230, 233, 234; 279/128, 131; 118/724, 725, 728, 621

[56] References Cited

U.S. PATENT DOCUMENTS

| | | | |
|---|---|---|---|
| 5,382,311 | 1/1995 | Ishikawa et al. | 118/728 |
| 5,413,360 | 5/1995 | Atari et al. | 279/128 |
| 5,531,835 | 7/1996 | Fodor et al. | 118/728 |
| 5,668,524 | 9/1997 | Aida et al. | 338/308 |
| 5,886,863 | 3/1999 | Nagasaki et al. | 361/234 |
| 5,886,864 | 3/1999 | Dvorsky | 361/234 |
| 5,927,077 | 7/1999 | Hisai et al. | 219/444.1 |

*Primary Examiner*—Sang Paik
*Attorney, Agent, or Firm*—Wilson, Sonsini, Goodrich & Rosati

[57] ABSTRACT

A thermal chuck or heat sink (10) has a lower surface (12) covered with fins (14) parallel to air flow (16), to increase the surface area and promote heat transfer. A pair of slots (32) near pedestal (20) (along the fins) effectively lowers the conductivity of the metal in the direction across the fins. Heat flowing through this region of lowered conductivity experiences a greater temperature drop. This raises the temperature at the adjacent parts of the top surface, and (for properly sized slots) results in circular isotherms. The circular isotherms are turned into a nearly isothermal surface by a precisely dimensioned groove (36) parallel to the top surface (22), extending around the circumference of the pedestal (20). Heat flowing into the outer regions of the circular surface (22) is forced to travel radially inward, thus raising the edge temperature (which would naturally be lower than the center). For properly sized slots (32) and groove (36), it is possible to achieve a nearly constant temperature top surface (22).

39 Claims, 4 Drawing Sheets

WAFER LEVEL BURN-IN AND TEST THERMAL CHUCK AND METHOD

TECHNICAl FIELD

This following invention relates to a type of heat sink for cooling a fabricated integrated circuit wafer under power, referred to as a thermal chuck. Typically, the thermal chuck is used in a burn-in oven. This thermal chuck removes heat from the powered wafer and transfers it to the high temperature air circulating in the oven. This particular application demands that the surface the wafer rests on be isothermal (at a constant temperature). The invention further relates to a method of temperature control for a workpiece, such as an integrated circuit wafer under power during burn-in.

After fabrication, many integrated circuits undergo the process of burn-in. An example of a burn-in system used for this purpose is disclosed in commonly assigned Brehm et al., U.S. Pat. No. 5,682,472, and is commercially available from the assignee under the designation MTX. In this process, the circuits are subjected to a variety of stresses outside their normal operating range to induce failures. Circuits that pass burn-in are much less likely to fail in the early part of their life. Over temperature operation is crucial to burn-in. For instance a temperature in the range of 125–150° C. is usually used to burn-in DRAM circuits.

The burn-in system considered here pertains to wafer level testing. In a system such as this, an integrated circuit wafer undergoes burn-in before separation into individual dies and traditional packaging. This introduces several problems not present in testing of traditionally packaged ICs. The integrated circuit wafer may optionally incorporate wafer scale packaging techniques for the individual ICs on the wafer. The present invention deals with transferring heat away from the wafer.

Packaged circuits usually undergo burn-in in a temperature controlled convection oven. The active area of a chip is much smaller than the outside dimensions of the package. Thus the package serves to aid in heat transfer to the air. In practice, the temperature of the circuits in this system is fairly uniform and easily controlled by varying the oven air temperature. In contrast, if an integrated circuit wafer is powered before separation into individual dies, the surface area is too small to transfer the heat generated to the air without excessive temperatures being generated. In addition, the burn-in process requires uniform temperatures, and this uniformity could not be achieved with such a system.

SUMMARY OF THE INVENTION

A thermal chuck in accordance with the invention has a high thermal conductivity member with a pedestal for receiving a workpiece for which a temperature is to be controlled. A heat transfer structure is thermally coupled by the member to the pedestal. A first structural modification to the member is adjacent to the pedestal. The first structural modification is configured to produce a set of concentric isothermal regions on a top surface of the pedestal, with the set having a shape corresponding to the shape of the workpiece. A second structural modification of the pedestal is adjacent to the member. The second structural modification is configured to convert the set of isothermal regions to a single essentially isothermal region.

In practice, the heat transfer structure is desirably a set of heat transfer fins extending along the member. The first structural modification is desirably at least one slot in the member adjacent to the pedestal and extending into the member toward the heat transfer fins. The second structural modification to the pedestal is desirably a groove extending around a periphery of the pedestal adjacent to the member. In a more general characterization, at least one structural modification may be made to the thermal chuck in order to provide a single essentially isothermal region on a surface of the thermal chuck receiving the workpiece.

A method for controlling temperature of a workpiece in accordance with the invention includes placing the workpiece on a surface of a high thermal conductivity heat transfer body. A set of isothermal regions is established at the surface of the heat transfer body. The set of isothermal regions has a shape corresponding to the shape of the workpiece. The set of isothermal regions is converted into a single essentially isothermal region. More generally, a single essentially isothermal region is established at the surface of the heat transfer body.

The thermal chuck and the method are desirably used for wafer level burn-in and test of integrated circuits. The system that is being used for wafer level burn-in and test consists of the wafer under test, a contactor and the associated electronics for activation and testing of the individual circuits on the wafer. The wafer is powered, and thus is generating heat internally. The wafer is both cooled and kept at a constant temperature by resting on the heat sink of this invention. The heat sink is installed in a modified convection oven. One heat sink is used for each wafer under test.

The heat sink and associated parts may be configured as a cartridge. If employed, the electrical portion of this cartridge contains a contactor (probe) to make electrical contact with appropriate contact points on the wafer, a substrate to route signals to the probe points, a connector to interface to the rest of the machine, and circuitry to control power applied to each circuit under test. Mechanical portions consist of a backing plate to apply planar force to the substrate, a guiding mechanism to insure linear travel, the heat sink itself (usually referred to as a thermal chuck), features used to move the wafer for alignment, a latching mechanism and a force delivery system.

DESCRIPTION OF SPECIFIC EMBODIMENTS

Figure 1:
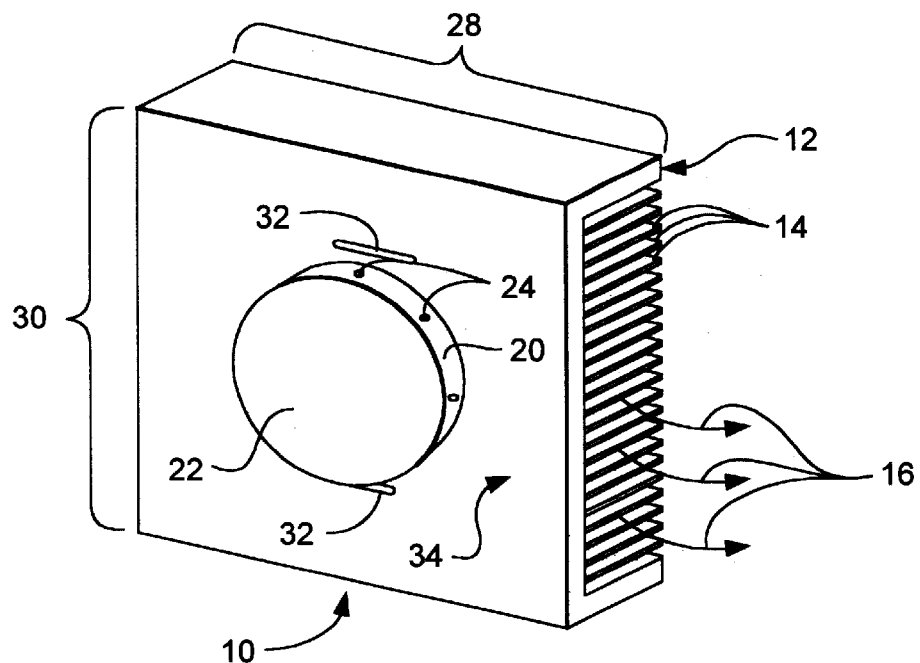
FIG. 1 is a perspective view of a thermal chuck in accordance with the invention.
Figure 2:
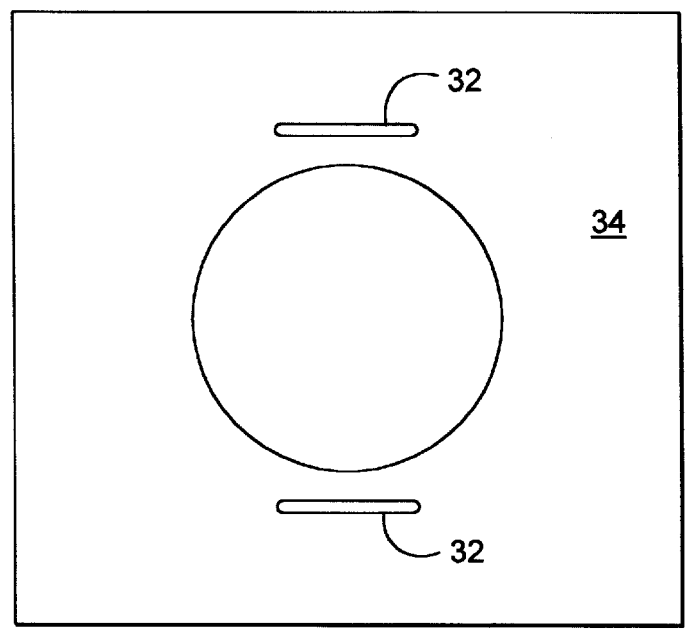
FIG. 2 is a plan view of the thermal chuck shown in FIG. 1.
Figure 3:
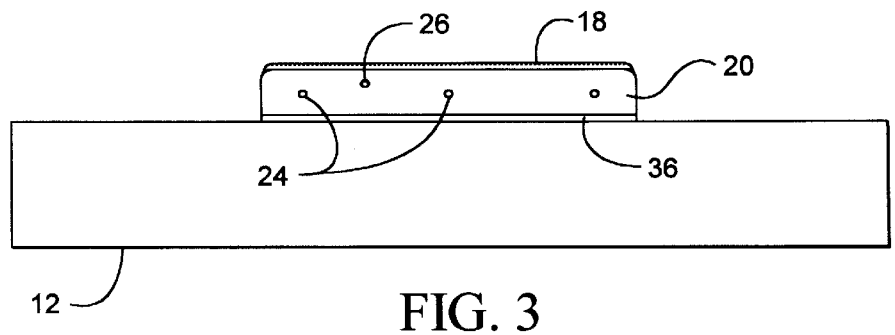
FIG. 3 is a side view of the thermal chuck shown in FIGS. 1 and 2.

As shown in FIGS. 1–3, the thermal chuck or heat sink 10 has features specific to its task. Lower surface 12 is covered with fins 14 parallel to air flow 16, to increase the surface area and promote heat transfer. Air from the convection oven of a burn-in system, such as a modified form of the MTX system identified above, is ducted through these fins. The fins may be interrupted and staggered to further promote heat transfer. These fins may also also interrupted for access to various mechanical features necessary for the operation of the mechanism. The overall size and shape of the chuck are determined from space considerations in the existing oven configuration, in this case, the oven configuration of the MTX system. A wafer 18 rests on the upper surface of the chuck. The feature that it rests on is a circular raised portion or pedestal 20 of a diameter appropriate to the wafer 18 under test. Top surface 22 of this raised area is polished and lapped to a high degree of smoothness and flatness. It may also contain vacuum grooves for wafer restraint. This top surface 22 receives plating or coating appropriate to the type of wafer under test. Protruding into the side of this pedestal (radially) are a number of cartridge heaters 24. These supply heat for some modes of operation, in order to achieve temperature control. A temperature sensor 26 is installed in the chuck near its top surface, to indirectly sense wafer temperature. In addition to these features, additional features specific to achieving temperature uniformity will be discussed below.

Temperature control of the wafer is accomplished in a manner similar to the present MTX burn-in and test system, as used with packaged devices on burn-in boards. The burn-in boards are replaced with a thermal chuck 10 for each wafer 18 under test. The convection oven and its associated temperature control is preserved for the wafer level system. The air from the convection oven is ducted through the fins of the wafer chuck, while a powered wafer is pressed against the top surface by the probe, substrate and backing plate. The oven is set for a temperature calculated using the characteristics of the thermal chuck and the wafer heat dissipation. Fine control of temperature is from heat addition using the aforementioned cartridge heaters 24. A standard temperature controller is used to supply power to these heaters and sense temperature.

General Nature of Invention—Heat Transfer Slots and Grooves for Temperature Uniformity It is desired to have a specified metallic surface, on an object of prescribed shape and prescribed thermal boundary conditions, have a specified temperature distribution while undergoing heat input on that surface in another specified distribution. Heat conducts through metallic objects very well, but an object designed with mechanical constraints will (in all likelihood) have an unsuitable temperature distribution on the specified surface. Heat conducts (and convects) through air orders of magnitude more poorly than through metals. The embodiment of the invention described herein introduces precisely dimensioned regions of metal removal that change the effective conductivity of the metallic object in certain regions and/or directions, thus allowing temperature distribution to be decoupled from the object's exterior physical dimensions and thermal boundary conditions. The result is the ability to tailor the temperature distribution on a given surface to a broad range of functions and/or values.

The wafer rests on the top surface 22 of the pedestal 20, as shown in FIG. 1. This surface experiences a heat flux, due to power consumed by the wafer 18 which rests upon it. The invention allows this surface to be isothermal, even though the outline dimensions of the heat sink were chosen for mechanical reasons.

First Feature—Linear Slots

In the particular thermal chuck 10 shown and described, there is an aspect ratio effect of the length 28 (along the fins) to the width 30. The result is the isotherms on the top surface 22 are elliptical in shape. The invention includes at least one precisely dimensioned slot 32 near the central raised surface (along the fins), that effectively lowers the conductivity of the metal in the direction across the fins. Heat flowing through this region of lowered conductivity experiences a greater temperature drop. This raises the temperature at the adjacent parts of the top surface, and (for properly sized slots) results in circular isotherms. For this particular application, the slots are best shown in FIG. 2. In this embodiment, the slots 32 extend completely through body 34 of the chuck 10 to one of the spaces between fins 14. In other embodiments, the slots could extend only part way through the body of the chuck, they could be curved, they could intersect with one of the fins 14, and/or they could be filled with a material having a different thermal conductivity.

Second Feature—Circumferential Groove

The second feature of the invention involves turning the now circular isotherms into a nearly isothermal surface. This is accomplished by a precisely dimensioned groove 36 parallel to the top surface 22, extending around the circumference of the pedestal 20, as shown in cross section in FIG. 3. Heat flowing into the outer regions of the circular surface 22 is forced to travel radially inward, thus raising the edge temperature (which would naturally be lower than the center). For a properly sized and shaped groove 36, it is possible to achieve a nearly constant temperature top surface 22.

In a specific example, for use with an 8 inch semiconductor wafer 18 and length and width 28 and 30 of the chuck each equal to 16 inches, the slots 32 are 3 inches long, ¼ inch wide and are spaced at a distance of 4.69 inches from the chuck center. The groove is 0.125 inch high and 0.75 inch deep.

The thermal chuck is fabricated from a high thermal conductivity material, such as aluminum or other suitable metal or other material. It may either be integrally formed by machining a single piece of the material or assembled by fastening separate pieces of the material together to give the configuration shown.

Figure 4:
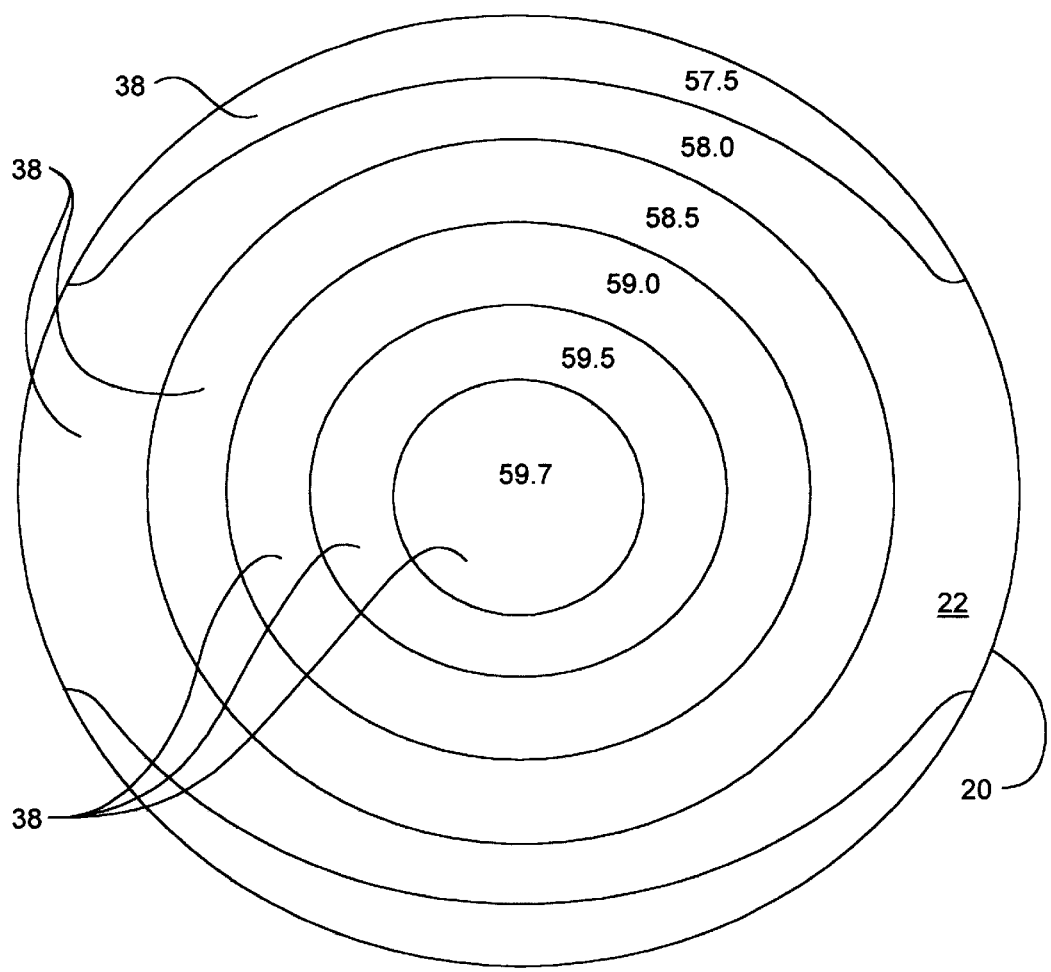
FIGS. 4–6 are plan views of a portion of the thermal chuck shown in FIGS. 1–3.
Figure 5:
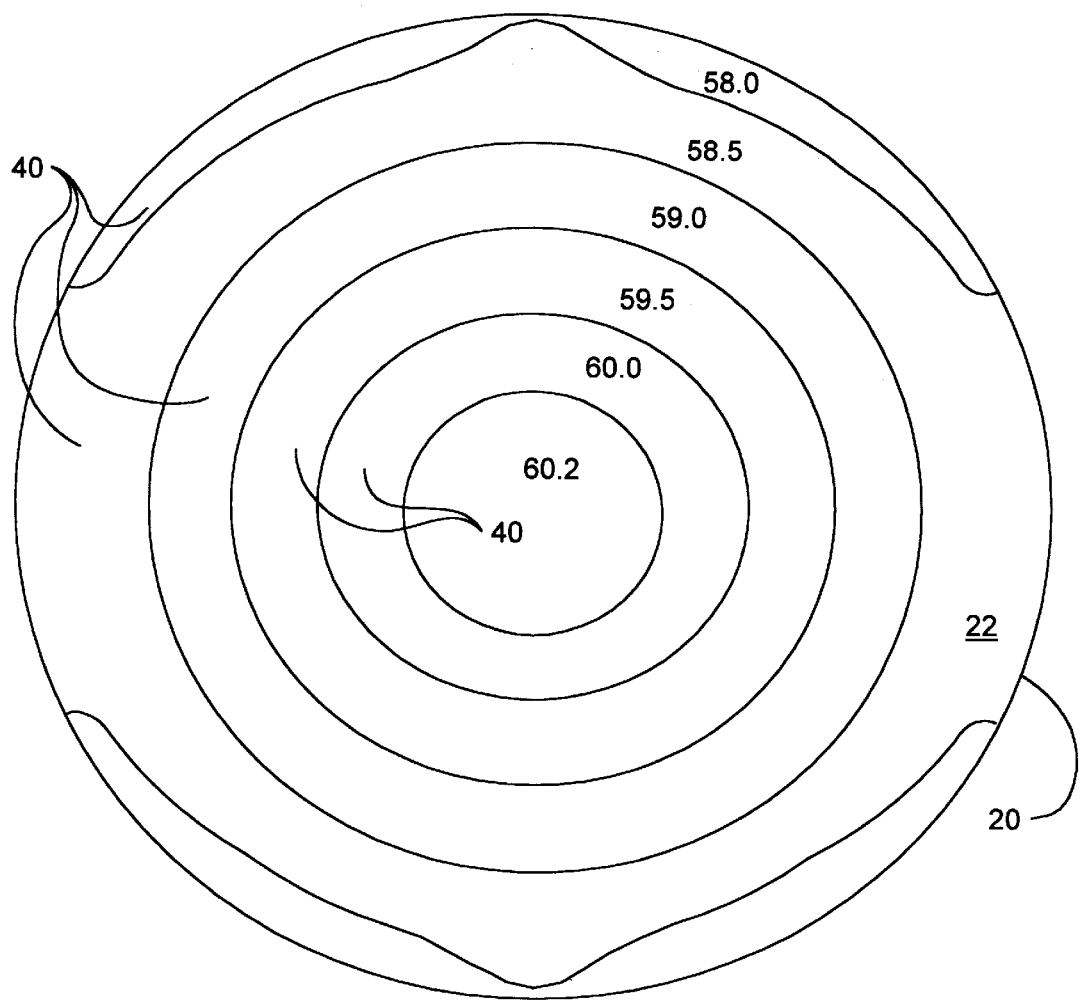
Figure 6:
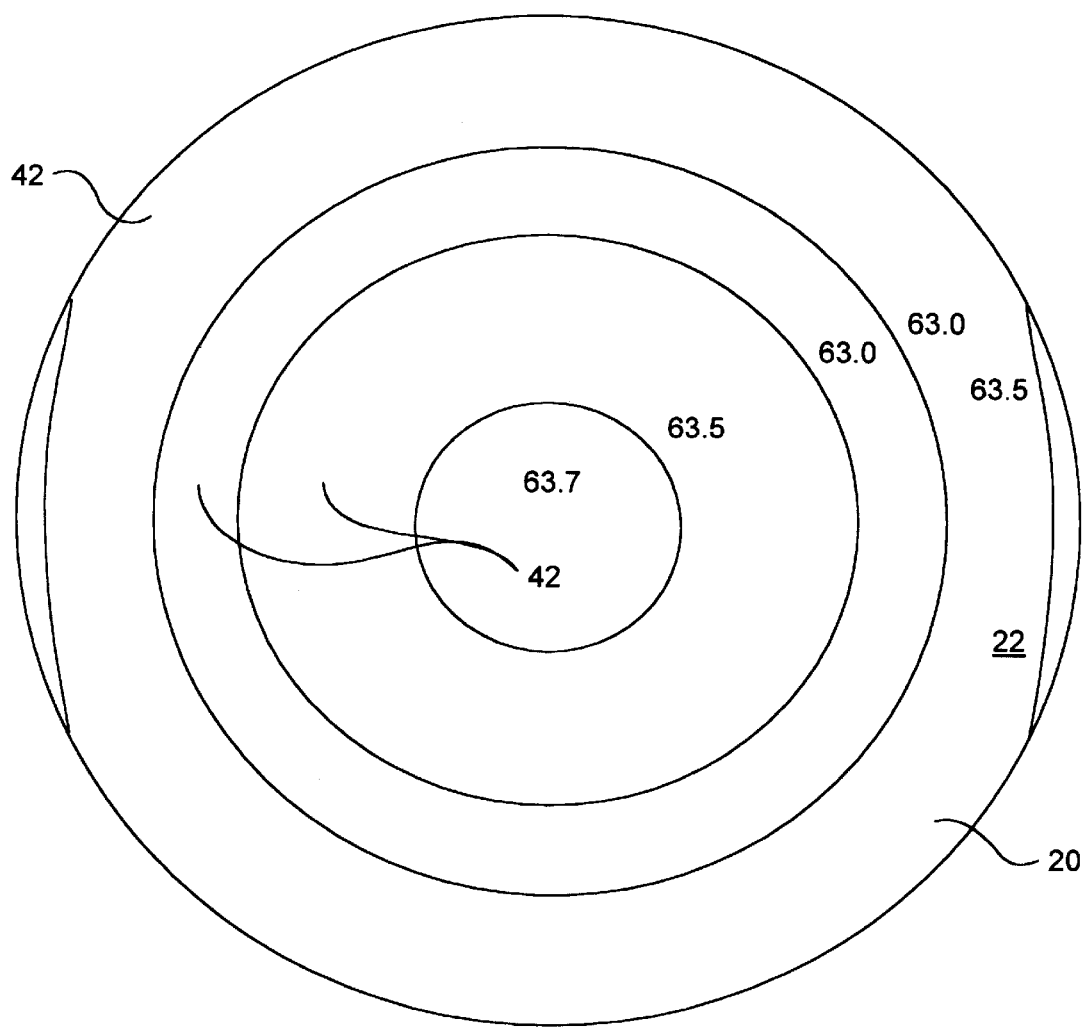

FIGS. 4–6, showing isothermal regions on the top surface 22 of the pedestal 20, are useful for a more complete understanding of the operation of the invention. FIG. 4 shows elliptical isothermal regions 38 formed in the top surface 22 of the pedestal 20 in the absence of the slots 32 and the groove 36. The temperature of each isothermal region 38 is shown in ° C. As shown in FIG. 5, when the slots 32 are provided, isothermal regions 40 assume an essentially circular shape. Adding the groove 36 causes the regions 42 shown in FIG. 6 to be essentially isothermal, by raising the temperature adjacent to the outer edge of the pedestal 20.

In practice, burn-in of integrated circuits is usually carried out at 125–150° C. In one typical cycle, the integrated circuits are heated to 125–150° C. for 6 hours, followed by electrical test for one-half hour at 70° C. During burn-in of a typical dynamic random access memory (DRAM) integrated circuit wafer, electrical signals supplying about 500 watts of power are supplied to the wafer. If the slots 32 and groove 36 are not provided on the thermal chuck, there is approximately a 3 degree variation in the temperature over the surface of the wafer. With the slots 32 and groove 36 on the thermal chuck, there is less than a one degree variation in the temperature over the surface of the wafer.

At higher power levels, the temperature variation over the surface of the wafer is more significant. For example, some logic devices require application of electrical signals producing a power input in excess of 1 kilowatt to the wafer. Certain logic devices require power inputs as high as 1.5 kilowatt. At 1.5 kilowatt of power to the wafer, if the slots 32 and slot 36 are not provided on the thermal chuck, there is approximately a 10° C. variation in the temperature over the surface of the wafer under these conditions. Such a temperature variation is a significant problem. With the slots 32 and groove 36 on the thermal chuck, there is only a two degree variation in the temperature over the surface of the wafer under these conditions.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A thermal chuck comprising:
   (A) a high thermal conductivity member having a pedestal for receiving a workpiece for which a temperature is to be controlled;
   (B) a plurality of heat transfer fins thermally coupled by said member to said pedestal;
   (C) at least one slot extending from said member adjacent to said pedestal into said member toward said heat transfer fins; and
   (D) a groove extending around a periphery of said pedestal adjacent to said member.

2. The thermal chuck of claim 1 in which said heat transfer fins extend in a generally horizontal direction along said member and said at least one slot comprises a first slot adjacent to a top side of said pedestal and a second slot adjacent to a bottom side of said pedestal.

3. The thermal chuck of claim 2 in which said pedestal is configured for receiving a semiconductor wafer by having an essentially circular surface facing upward from said member.

4. The thermal chuck of claim 1 additionally comprising:
   (E) at least one heater in said pedestal.

5. The thermal chuck of claim 4 in which said at least one heater comprises a plurality of cartridge heaters.

6. The thermal chuck of claim 1 in which the workpiece is a semiconductor wafer.

7. A thermal chuck comprising:
   (A) a high thermal conductivity member having a pedestal for receiving a workpiece for which a temperature is to be controlled;
   (B) a fluid flow heat transfer structure extending in a generally horizontal direction along said member and thermally coupled by said member to said pedestal;
   (C) a first region of material removal in said member adjacent to said pedestal, said first region of material removal being configured to produce a set of concentric isothermal regions on a top surface of said pedestal by changing the effective thermal conductivity of said member in a first direction, with the set having a shape corresponding to the shape of the workpiece; and
   (D) a second region of material removal in said member at said pedestal, said second structural modification being configured to convert the set of isothermal regions to a single essentially isothermal region by changing the effective conductivity at a periphery of said pedestal.

8. The thermal chuck of claim 7 in which said fluid flow heat transfer structure comprises a plurality of heat transfer fins.

9. The thermal chuck of claim 8 in which said first region of material removal comprises at least one extending from said member adjacent to said pedestal into said member toward said heat transfer fins.

10. The thermal chuck of claim 9 in which said at least one slot comprises a first slot adjacent to a top side of said pedestal and a second slot adjacent to a bottom side of said pedestal.

11. A thermal chuck of claim 7 in which said second region of material removal comprises a groove extending around a periphery of said pedestal adjacent to said member.

12. The thermal chuck of claim 11 in which said pedestal is configured for receiving a semiconductor wafer by having an essentially circular surface facing upward from said member.

13. The thermal chuck of claim 7 additionally comprising:
    (E) at least one heater in said pedestal.

14. The thermal chuck of claim 13 in which said at least one heater comprises a plurality of cartridge heaters.

15. The thermal chuck of claim 7 in which the workpiece is a semiconductor wafer.

16. A thermal chuck comprising:
    (A) a high thermal conductivity member having a pedestal for receiving a workpiece for which a temperature is to be controlled;
    (B) a fluid flow heat transfer structure extending in a generally horizontal direction along said member and thermally coupled by said member to said pedestal;
    (C) at least one structural modification to said thermal chuck, the at least one structural modification being in the form of a groove extending around a periphery of said pedestal to provide a single essentially isothermal region on a top surface of said pedestal.

17. The thermal chuck of claim 16 in which said heat transfer structure comprises a plurality of heat transfer fins.

18. The thermal chuck of claim 16 in which said at least one structural modification additionally comprises a first slot adjacent to a top side of said pedestal and a second slot adjacent to a bottom side of said pedestal.

19. The thermal chuck of claim 16 in which said pedestal is configured for receiving a semiconductor wafer as the workpiece by having an essentially circular surface facing upward from said member.

20. The thermal chuck of claim 16 additionally comprising:
    (E) at least one heater in said pedestal.

21. The thermal chuck of claim 20 in which said at least one heater comprises a plurality of cartridge heaters.

22. A method for controlling temperature of a workpiece, which comprises:
    (A) changing the effective thermal conductivity of a high thermal conductivity heat transfer body in a first direction by forming a first region of material removal in the heat transfer body and in a second direction by forming a second region of material removal in the heat transfer body;
    (B) placing the workpiece on a surface of the high thermal conductivity heat transfer body;
    (C) establishing a set of isothermal regions at the surface of the heat transfer body using a fluid flow heat transfer structure, the set of isothermal regions having a shape corresponding to the shape of the workpiece as a result of changing the effective thermal conductivity in the first direction; and
    (D) converting the set of isothermal regions into a single essentially isothermal region using the heat transfer structure and the second region of material removal.

23. The method of claim 22 additionally comprising the step of heating the workpiece to an elevated temperature.

24. The method of claim 23 in which the surface of the high thermal conductivity heat transfer body is configured to receive a semiconductor wafer as the workpiece by having a circular configuration.

25. The method of claim 24 in which the semiconductor wafer is heated by supplying an electrical signal to the semiconductor wafer.

26. The method of claim 25 in which the temperature of the semiconductor wafer is controlled at least in part by placing the semiconductor wafer in heated air.

27. The method of claim 26 in which the semiconductor wafer is further heated by separately heating the pedestal.

28. A method for controlling temperature of a workpiece, which comprises:
(A) modifying heat transfer characteristics of a high thermal conductivity heat transfer body by forming at least one material removal region in the heat transfer body;
(B) flowing a heat transfer fluid in engagement with the heat transfer body to carry out heat transfer, and
(C) establishing a single essentially isothermal region at the surface of the heat transfer body by interaction of the heat transfer fluid and the at least one material removal region.

29. The method of claim 28 additionally comprising the step of heating the workpiece to an elevated temperature.

30. The method of claim 29 in which the surface of the high thermal conductivity heat transfer body is configured to receive a semiconductor wafer as the workpiece by having a circular configuration.

31. The method of claim 30 in which the semiconductor wafer is heated by supplying an electrical signal to the semiconductor wafer.

32. The method of claim 31 in which temperature of the semiconductor wafer is controlled at least in part by placing the semiconductor wafer in heated air.

33. The method of claim 32 in which the semiconductor wafer is further heated by separately heating the pedestal.

34. The method of claim 28 in which the single essentially isothermal region at the surface of the heat transfer body is established by establishing a set of isothermal regions at the surface of the heat transfer body, the seat of isothermal regions having a shape corresponding to the shape of the workpiece; and converting the set of isothermal regions into a single esentially isothermal.

35. A thermal chuck comprising:
(A) a high thermal conduntivity member having a pedestal for receiving a workpiece for which a temperature is to be controlled;
(B) a fluid flow heat transfer structure extending in a generally horizontal direction along said member and thermally coupled by said member to said pedestal;
(C) at least one region of material removal in said member adjacent to said pedestal, said at least one region of material removal being configured to provide a single essentially isothermal region of a surface of said pedestal by interaction of said fluid flow heat transfer structure and said at least one region of material removal.

36. The thermal chuck of claim 35 in which said pedestal is configured for receiving a semiconductor wafer by having an essentially circular surface facing upward from said member.

37. The thermal chuck of claim 35 additionally comprising:
(D) at least one heater in said pedestal.

38. The thermal chuck of claim 37 in which said at least one heater comprises a plurality of cartridge heaters.

39. The thermal chuck of claim 35 in which the high thermal conductivity member is a metal member.

* * * * *